United States Patent
Grootegoed et al.

(10) Patent No.: US 6,406,555 B1
(45) Date of Patent: *Jun. 18, 2002

(54) POINT OF USE DILUTION TOOL AND METHOD

(75) Inventors: James A. Grootegoed, Chandler; James F. Vanell, Tempe, both of AZ (US)

(73) Assignee: Motorola Inc., Schaumburg, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/495,180

(22) Filed: Feb. 1, 2000

Related U.S. Application Data

(63) Continuation-in-part of application No. 08/886,741, filed on Jul. 1, 1997, now Pat. No. 6,070,600.

(51) Int. Cl.$^7$ ................................................ B08B 3/00
(52) U.S. Cl. ........................ 134/36; 148/240; 210/406; 137/604
(58) Field of Search ............................ 134/111, 50, 109, 134/110, 113, 902, 95.2, 95.3, 137; 366/131, 132, 152.5, 160; 259/4; 204/98; 148/240; 137/604; 99/323.2; 423/521; 210/406

(56) References Cited

U.S. PATENT DOCUMENTS

| | | | | |
|---|---|---|---|---|
| 3,286,992 A | * | 11/1966 | Armeniades | 259/4 |
| 3,905,395 A | * | 9/1975 | Hupe | 137/604 |
| 4,159,929 A | * | 7/1979 | Grotheer | 204/98 |
| 4,506,987 A | * | 3/1985 | Daughton et al. | 366/160 |
| 4,531,456 A | * | 7/1985 | Kemp, Jr. et al. | 99/323.2 |
| 5,316,384 A | * | 5/1994 | Corso | 366/338 |
| 5,439,663 A | * | 8/1995 | Manganaro et al. | 423/521 |
| 5,779,355 A | * | 7/1998 | Pullman | 366/137 |
| 5,792,354 A | * | 8/1998 | Aksberg | 210/406 |
| 5,985,045 A | | 11/1999 | Kobayashi | |
| 6,070,600 A | * | 6/2000 | Grootegoed et al. | 134/111 |

FOREIGN PATENT DOCUMENTS

| | | | |
|---|---|---|---|
| JP | 11-342323 | * | 12/1999 |

* cited by examiner

Primary Examiner—Randy Gulakowski
Assistant Examiner—Gentle E. Winter
(74) Attorney, Agent, or Firm—A. Kate Huffman; Kim-Marie Vo

(57) ABSTRACT

A dilution tool (100) and a method to prepare a solution by mixing of two fluids in a filter (130) to form a desired solution. Sealless pumps (141, 142) are driven by a common motor (143) to pump the fluids at a constant ratio of their respective flow rates while the flow rate of the solution varies. The conductivity or resistivity of the solution is measured with a measurement device (166) to determine the concentration.

14 Claims, 2 Drawing Sheets

US 6,406,555 B1

POINT OF USE DILUTION TOOL AND METHOD

RELATED APPLICATIONS

This application is a continuation-in-part of Ser. No. 08/886,741 filed on Jul. 1, 1997 now U.S. Pat. No. 6,070,600.

BACKGROUND OF THE INVENTION

The present invention relates in general to preparing a solution by mixing through a filter, and more specifically to preparing a solution through a filter to remove residue from an integrated circuit.

Semiconductor technology is producing integrated circuits that include more transistors with smaller dimensions and more detailed geometric features. The accurate reproduction of such devices requires a highly planar wafer surface with low levels of particles and other residue. Hence, where accurate geometries are needed, most manufacturing processes include surface planarization steps.

For example, a chemical-mechanical polishing (CMP) step is often used to polish away a blanket tungsten layer to the remaining tungsten plugs or to planarize an interlayer dielectric (ILD) material that isolates one interconnect layer from another. The wafer surface is mechanically polished using a slurry comprised of alumina particles suspended in an aqueous solution having a pH of 1.8–3.8. However, the low pH of the aqueous solution produces a zeta potential in the alumina particles opposite to that of the wafer, which creates an attraction force that causes many of the alumina particles to adhere to the wafer surface. Such particles produce photolithographic defects and wafer contamination which can result in a failure of the integrated circuit.

The particles are removed with a cleaning solution whose pH is set to about 12.0 to alter the polarity of the zeta potential and weaken the attraction force between the wafer and the particle. Typically, an ammonium hydroxide solution having a 2% concentration by weight provides the correct pH for removing particles. Control over the concentration is important. Too low a concentration does not sufficiently raise the pH and therefore inhibits particle removal by inadequately altering the zeta potential of the particles. Too high a concentration results in a more caustic solution which can corrode wafer materials such as tungsten plugs which are used to fill interlayer via openings.

Ammonium hydroxide is commercially available at a 30% concentration by weight. Prior art processes produce a 2% concentration by manually diluting 30% ammonium hydroxide with de-ionized (DI) water in a bulk storage tank, where it is hand-mixed and stored until needed. However, hand-mixing and hand-pouring such a strongly basic solution presents a safety hazard to people handling the chemical and those working in the area of the storage tank. Moreover, ammonia gas is highly volatile. When ammonia evaporates from the solution, not only does the safety hazard increase, but also the concentration of the $NH_4OH$ in the cleaning solution drops significantly, lowering the pH of the diluted solution below acceptable levels.

Hence, there is a need for an apparatus and method of forming a homogeneous mixture of fluids, such as preferably a dilution of ammonium hydroxide, by mixing through a filter. More particularly, there is a need for an apparatus and method to remove residue from a semiconductor wafer which reduces evaporation and avoids the risk of exposing nearby persons to hazardous chemicals.

DETAILED DESCRIPTION OF THE DRAWINGS

Integrated circuit manufacturing processes include numerous steps in which substances are introduced in a wafer or on its surface, and other steps in which material is removed. For instance, a photolithographic step includes depositing a photoresist on the wafer surface, developing the photoresist and removing the undeveloped portion to form a pattern of geometric shapes for exposing portions of the wafer to further processing steps. When these steps are completed, the remaining photoresist is removed. Such photolithographic steps are examples where all of an originally deposited material is residue which must be removed to prevent the fabrication of a defective device. Similarly, a silicon dioxide layer such as an interlayer dielectric is deposited or grown on the wafer and a pattern is formed with a photoresist layer. The silicon dioxide is selectively etched in the exposed portions of the photoresist to provide openings for connecting between interconnect layers.

In each of the above examples, processing steps are included to remove unwanted material from the wafer to prevent an integrated circuit defect or failure. Such unwanted material is designated as residue, and includes unwanted material remaining from previous steps as well as material from the current step, such as particles or other impurities introduced by a non-deposition step such as a cleaning step.

Various solutions are used in integrated circuit manufacturing processes, including the removal of residue from the wafers. Because of the high level of cleanliness required in fabricating semiconductor devices as well as the unique properties of some processing materials, it is often advantageous to form such solutions in the manufacturing plant by combining two or more fluids. In the present invention, a solution includes at least a homogeneous mixture of fluids which does not settle and whose proportions are not fixed, i.e., can be varied. For example, a solution can include true solutions, colloidal solutions, suspensions and the like.

Figure 1:
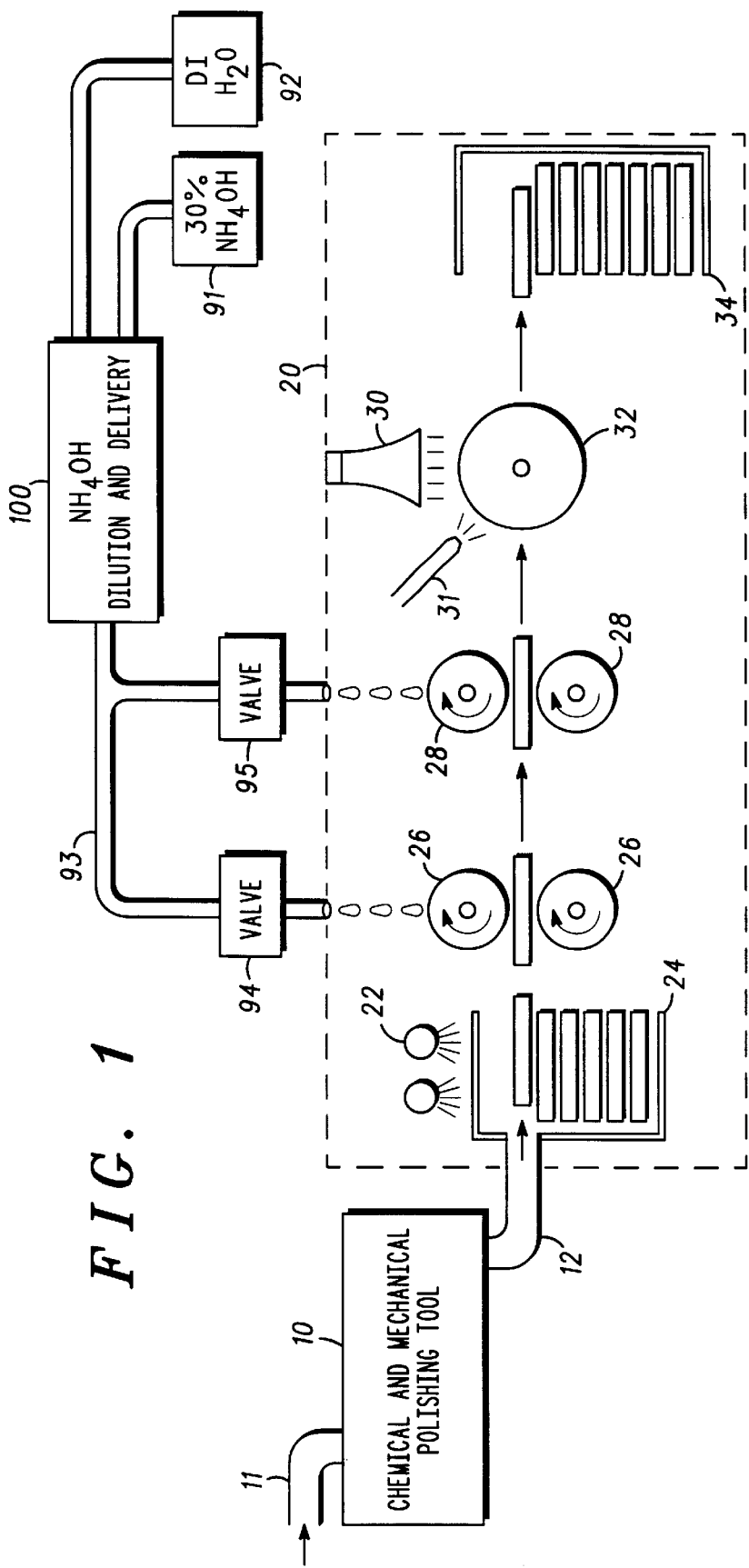
FIG. 1 is a flow diagram of an integrated circuit manufacturing apparatus.

FIG. 1 is a diagram showing the flow of a semiconductor wafer through part of an integrated circuit manufacturing system which includes a chemical-mechanical polishing (CMP) tool 10, a wafer scrubber 20 and a dilution tool 100.

CMP tool 10 receives an incoming semiconductor wafer at an input 11 and produces a polished, planarized wafer at an output 12. CMP tool is fully automated such that wafers are handled within CMP tool 10 by means of robot arms or similar devices controlled by a control unit within the tool. Typically, the incoming wafer is received after depositing an interconnect dielectric layer or after a metal such as tungsten has been applied as a blanket layer to plug the interlayer via openings in the dielectric layer.

In the case of planarization after a tungsten deposition, polishing is accomplished using a slurry comprised of metal particles, a buffer and an oxidizing chemical such as ferric nitrate. For example, a typical slurry includes alumina particles mixed with de-ionized (DI) water with potassium iodate functioning as the buffer. The slurry is applied to a first spinning platen designated as the primary platen. The alumina particles produce a highly abrasive slurry which is applied at a rate that ensures that a specified amount of material is abraded from the wafer at a determinable rate. Once the primary platen is completely wetted by the alumina slurry, a wafer is held face down against the surface of the rotating primary platen by a robot arm that activates polishing by rotating the wafer in the opposite direction as the platen.

The above polishing step leaves a residue of potassium iodate, ferric nitrate, tungsten and alumina particles on the wafer. Such materials are contaminants which can cause defects in the wafer that result in inaccurate geometric patterns being produced, structural defects in an integrated circuit component, or corrosion damage which can lead to an integrated circuit failure. In the case of alumina particles, their hardness leaves scratches on the surface of the wafer which can also damage an integrated circuit. Therefore, after the first polishing, the wafer is rinsed with DI water to remove the potassium iodate, ferric nitrate, and some of the loose alumina particles. Other alumina particles remain attached to the wafer because their zeta potential is opposite in polarity to the zeta potential of the wafer surface, which produces an attraction force causing the particles to adhere to the wafer.

After rinsing, the wafer is transported to a secondary rotating platen in CMP 100 to receive a second polishing step to buff the scratches from the wafer surface. This step is similar to the first polishing step except that the slurry particles are comprised of softer silicon dioxide in a solution of $NH_4OH$ or potassium hydroxide and DI water.

Potassium hydroxide is used to raise the pH of the slurry so that the zeta potential of the silicon dioxide in the slurry is sufficient to prevent agglomeration. As a secondary effect, the zeta potential of the alumina used for the metal polish step is altered with the result being less affinity of the alumina particles for the oxide surface to facilitate the removal of the alumina particles. After buffing, the wafer again is rinsed with DI water and kept wet until further processing. Once a wafer dries, it is nearly impossible to remove the particles without damaging the wafer.

A batch of wet polished wafers are transported from CMP tool 10 to wafer scrubber 20. The wafers are loaded in a cassette 24 and kept wet with DI water from spray heads 22. A wafer is scrubbed by passing between brushes 26, which are formed from a soft, spongy material such as polyvinyl acetate (PVA) and include small protrusions or stubs (not shown) around the circumference. Brushes 26 rotate as the wafer passes such that the protrusions conform to the wafer to gently rub off particles and other residue without damaging the surface. When hydrated, brushes 26 have a high water content, which provides self-lubrication to maintain contact without damaging the wafer.

A 2% $NH_4OH$ solution is formed in dilution tool 100 and controlled by a valve 94 to drip onto brush 26 to scrub a wafer. The 2% $NH_4OH$ solution has a pH of approximately 12.0, which further modifies the zeta potential of the remaining alumina particles on the wafer to facilitate their removal with brush 26. Control of the $NH_4OH$ concentration is critical, because if the concentration is too low, the zeta potential is insufficiently modified and alumina particles retain their affinity to the wafer. If the concentration is too high, wafer materials such as tungsten plugs erode. In either case, damage to the wafer and device failure is likely. In one process, a concentration ranging from 1.5–2.5% by weight has been determined to be adequate for removing alumina particles and other residue without damage to the wafer. Other methods besides dripping could be used to apply $NH_4OH$ solution to brush 26. For example, spraying could be used provided that the evaporation of ammonia ($NH_3$) from the finely divided spray particles is controlled to prevent a reduction in the concentration of the solution and a lowered pH.

After scrubbing a number of wafers, particulate matter and other wafer residue accumulate in brushes 26, some of which can be re-introduced onto the wafer. Therefore, a second scrubbing step is performed using brushes 28, which are of similar composition as brushes 26 but are cleaner because much of the residue was previously removed by brushes 26. Valve 95 controls the flow rate for dripping 2% $NH_4OH$ solution onto brushes 28 in a step similar to the step described for brushes 26. Brushes 26 and 28 are rinsed from time to time with the 2% $NH_4OH$ to remove accumulated particles.

The wafer is moved to a spin drier comprising an infrared or equivalent heat source 30, a spray nozzle 31 and a spinner 32. The remaining residue is removed from the wafer by rinsing with DI water applied through nozzle 31 while the wafer spins on spinner 32. After rinsing, nozzle 31 is turned off and heat source 30 is switched on to spin dry the wafer. The dried wafer is loaded in a dry cassette 34 for removal from scrubber 20.

$NH_4OH$ is typically obtained in high concentrations which, owing to its hazardous nature, reduces the number of containers that are transported and handled. A standard 30% concentration is widely available commercially and is typically used. Dilution tool 100 receives the 30% $NH_4OH$ from a storage tank 91 and DI water from a storage tank 92. The 30% $NH_4OH$ is diluted with DI water to produce a solution of $NH_4OH$ with a 2% concentration which flows through tube 93 to valves 94–95 and to scrubber 20 as described above.

As noted above, the removal of alumina particles and other residue from a wafer after CMP processing requires a concentration ranging from 1.5–2.5%. In prior art $NH_4OH$ dilution tools, the 30% solution is manually mixed with DI water and the dilute solution is poured into a storage tank. The storage tank is manually transported and plumbed into the cleaning tool and pressurized with nitrogen for delivering 2% $NH_4OH$ when needed. Such systems have several drawbacks, including the safety hazard presented by hand-mixing and hand-pouring a highly caustic substance such as $NH_4OH$. Moreover, there is a high degree of variation in the concentration of the dilute solution due to the volatile nature of $NH_3$ gas, which can evaporate from the solution during mixing, during storage, or whenever the solution is exposed to the atmosphere.

Figure 2:
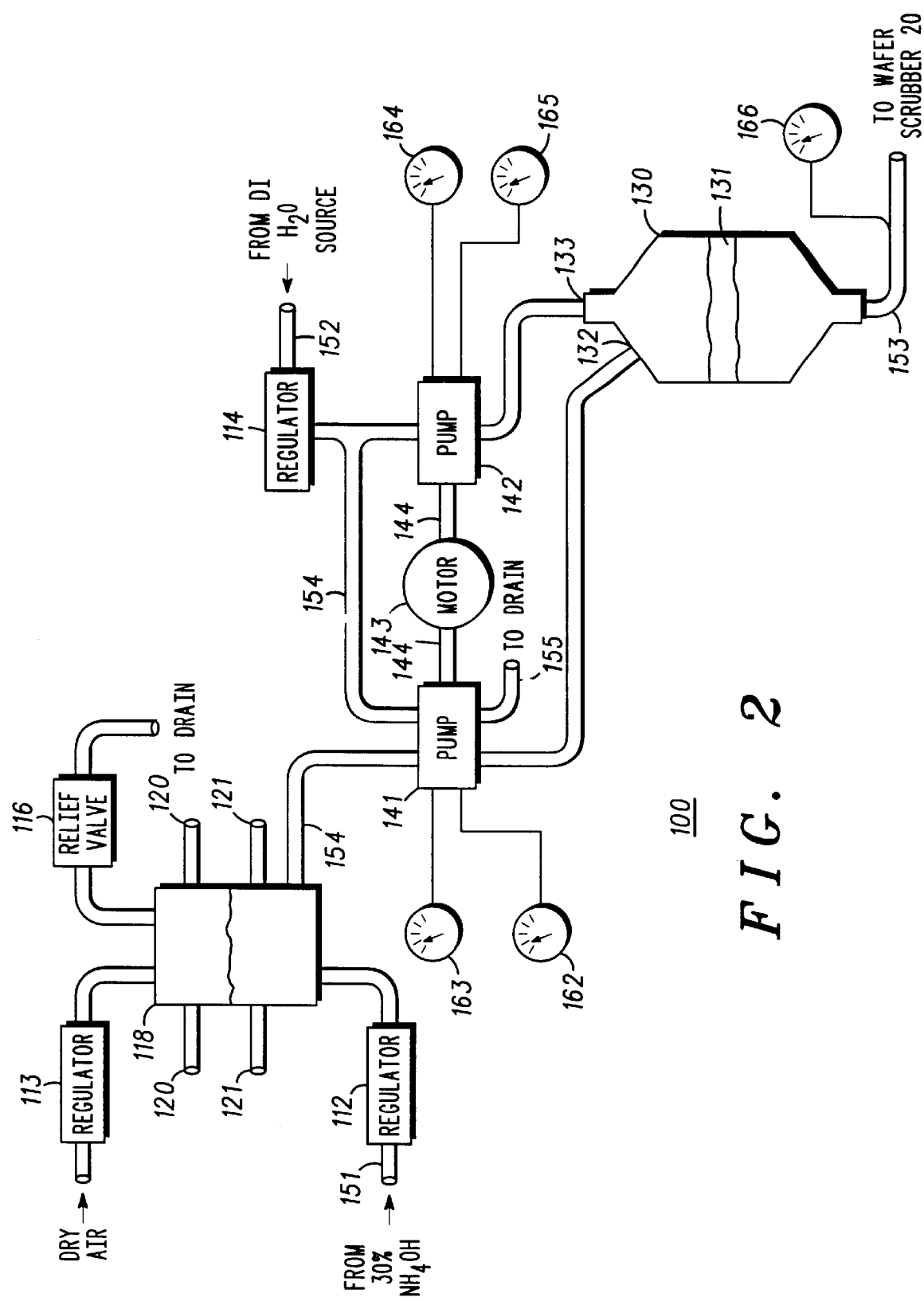
FIG. 2 is a diagram of an ammonium hydroxide dilution tool.

FIG. 2 is a schematic diagram of a dilution and delivery tool 100 including pressure regulators 112–114, a pressure relief valve 116, a storage ampule 118, a filter 130, a conductivity meter 166, pumps 141–142 and a motor 143. Bulk volumes of 30% $NH_4OH$ solution are stored in a centralized chemical distribution module (CDM) for delivery to various processing stations in a wafer fabrication facility. In particular, 30% $NH_4OH$ is delivered to dilution tool 100 through a tube 151. DI water is also pumped with a pressure in a range from 10,500–42,200 kilograms per square meter ($Kg/M^2$) gauge through tube 152. Pressure regulator 113 reduces the pressure going into ampule 118 and pump 142 to approximately 3,500 $Kg/M^2$ gauge.

If a problem arises in the CDM delivery system, the supply of 30% $NH_4OH$ to dilution tool 100 could be interrupted. With some prior art systems in which the CDM delivers 2% $NH_4OH$ directly to the wafer scrubber, such interruptions immediately result in inadequate wafer scrubbing. Moreover, when multiple processing stations require delivery at the same time, the delivery pressure can drop substantially, causing a failure where processing steps are timed or rely on a minimum pressure to function.

To reduce the occurrence of such supply interruptions or pressure variations, the 2% $NH_4OH$ solution is produced locally near wafer scrubber 20. Ampule 118 provides local buffer storage to decouple dilution tool 100 from CDM delivery problems, operating as a local reservoir to ensure a continuous supply of 30% $NH_4OH$ to dilution tool 100. Sensors 120–121 are capacitive sensors used to detect the fluid level in ampule 118. When ampule 118 is full, i.e., at the level of sensors 120, a signal is sent to the CDM to stop delivering $NH_4OH$. When the fluid level of ampule 118 is low, i.e., at the level of sensors 121, a signal is sent to the CDM to resume delivery of $NH_4OH$. Sensors 120–121 are mounted on the outside of ampule 118 to avoid leaks and corrosion.

Continuity in the 30% $NH_4OH$ supply is provided by setting sensors 121 to send a delivery command to the CDM before ampule 118 is empty, while an adequate amount of $NH_4OH$ remains in ampule 118 to operate dilution tool 100 until the CDM has time to replenish the supply. For example, sensors 121 can be set to send a delivery signal to the CDM when a forty-five minute supply of $NH_4OH$ remains in ampule 118. To further increase the reliability of dilution tool 100, sensors 120 and 121 are configured in duplicate to provide redundancy as shown. Each of the sensors 120 and 121 communicates with the CDM independently.

Clean, dry air is pressurized and coupled to ampule 118 through a pressure regulator 113, which maintains a constant positive pressure in ampule 118 to prevent effervescence and to keep pump 141 primed to avoid pump cavitation. In addition, the constant pressure within the ampule 118 allows decoupling of bulk supply pressure, with its attendant variations in pressure, thus ensuring a stable inlet pressure at the metering pump 141. In one embodiment, pressure regulator 113 is configured to maintain the pressure within ampule 118 between 3,500 and 5,625 $Kg/M^2$ gauge. To keep the fluids from deteriorating from stagnation, with the associated loss of NH gas due to effervescence, dilution tool 100 maintains an intermittent flow of 2% $NH_4OH$ to wafer scrubber 20 even when wafers are not being scrubbed. This flow ensures the purity of the chemicals in that only a miniscule residue volume, and preferably a zero residue volume, of the chemicals is present in the system. The presence of an intermittent flow also has the advantage of continuously cleaning particles from brush 26. When ampule 118 is being refilled, the incoming $NH_4OH$ increases the pressure in ampule 118 above 5,625 $Kg/M^2$ gauge. A pressure relief valve 116 is coupled to ampule 118 to bleed off the excess air/$NH_3$ mixture to maintain the pressure in tube 154 within the specified range of 3,500–5,625 $Kg/M^2$ gauge.

Pumps 141–142 are sealless metering pumps which are commercially available and have numerous advantages when used in semiconductor manufacturing. The wetted components of pumps 141–142 are fabricated with fluoropolymers such as polytetrafluoroethylene (PTFE) and ceramics to allow pumping a wide variety of chemicals without corroding. For example, citric, oxalic and glacial acetic acids can be pumped without damage as well as $NH_4OH$ and potassium hydroxide. In addition, the pump rotor does not contact the wall of the pump cavity, which reduces friction and wear and prevents contamination from particles abraded from the pump. As a result, semiconductor processing chemicals such as $NH_4OH$ can be pumped while maintaining a high level of purity.

The flow rates through pumps 141–142 are easily and accurately controlled by an external adjustment that tilts the angle of the rotating piston within the pump cavity (stroke volume). The external adjustment may be controlled either manually or by a servo control in either an open or closed loop system as is well known in the art.

Moreover, flow can be accurately regulated down to low levels by adjusting the motor speed (stroke rate). In one embodiment, pump 141 has a small pump head which produces a flow rate of $NH_4OH$ of four microliters per revolution. Hence, when operating at a low speed of three revolutions per second, the flow rate is twelve microliters per second. Dial indicators 162–165 reveal the amount of tilt in each pump head in order to calibrate flow rates for pumps 141–142, which can be varied manually, mechanically, electronically, etc. Once set, the flow rates remain in a constant ratio even when the overall volume of fluid through pumps 141–142 varies. Alternatively, one dial indicator per pump head will indicate pump tilt.

Pump 142 receives DI water through an intake tube 152 at a pressure between 24,600 and 26,725 $Kg/M^2$ gauge. A pressure regulator 114 maintains pressure going into pump 142 between 3,500–5,625 $Kg/M^2$ gauge. Pump 142 is of similar construction as pump 141 but is substantially larger because fifteen times more water flows through pump 142 to dilute the 30% $NH_4OH$ solution down to a 2% concentration.

Motor 143 drives pumps 141–142 with a single shaft 144 to ensure that pumps 141–142 rotate at the same speed and therefore provide $NH_4OH$ and DI water flow rates at a constant ratio. A fixed volume of fluid is pumped through each of the pumps 141–142 during each revolution or cycle of motor 143, so the flow rates can be varied together by adjusting the speed of motor 143. That is, to produce a larger volume of 2% $NH_4OH$ solution, the speed of motor 143 is increased accordingly. As long as the fluid pressure going into pumps 141–142 is maintained within the specified range, the ratio of the flow rates of 30% $NH_4OH$ to DI water remains constant at the higher speed. Such speed control can be provided by an operator or by using sensors (not shown) coupled to motor 143 through a feedback mechanism (not shown) from wafer scrubber 20. This arrangement allows time-of-use mixing since the pump can generate, in real time, as much or as little 2% $NH_4OH$ as required to support the cleaning process.

Because pumps 141–142 are sealless, a clearance, e.g., of twenty millionths of a centimeter, is provided between the rotor and pump cavity wall to prevent friction from abrading particles from the pump. This clearance results in a predetermined portion of chemicals slipping past the pump piston under pressure, which takes the pump out of calibration. For example, pumps 141–142 have approximately one percent pump slip, which means that one percent of the flow is due to input pressure rather than pump action. If the input pressure is too high, the percentage of pump slip increases and results in a deviation from the desired flow rate. Such a deviation can alter the concentration of the solution and result in inadequate or excessive scrubbing of the semiconductor wafer. To maintain the ratio of $NH_4OH$ and DI water at a constant level, regulators 112–114 maintain the pressure of fluids going into pumps 141–142 within a range from 3,500–5,625 $Kg/M^2$ gauge.

A wetting line 154 runs from the DI water line to pump 141 to function as a wetting gland of pump 141. A continuous trickle of DI water to wet the rotor of pump 141 provides a wet seal to prevent volatile $NH_3$ from evaporating from the 30% NH$_4$OH solution and escaping into the atmosphere as pump 141 rotates. Such wetting prevents NH$_3$ from escaping to create a hazard to the environment or to persons in the vicinity. The trickle flow has the additional advantage of preventing stagnation to ensure the purity of the DI water. Excess DI water is drained from pump 141 through tube 155.

Filter 130 provides a filtering function as well as a mixing function as described below. The filtering function is achieved with a filter element 131 formed from PTFE which screens out particles larger than 0.2 micrometers in diameter. The alumina particles in the CMP slurry are larger than 0.2 micrometers in diameter, so effective cleaning requires a 2% NH$_4$OH solution having particles less than 0.2 micrometers in diameter.

Some prior art systems use a manifold to mix the constituent fluids. However, manifold mixing requires a high rate of flow to agitate the fluids sufficiently to prevent the formation of isolated layers in the manifold. Where the flow rates are relatively low, such as in dilution tool 100, there is insufficient agitation present to reliably form a homogeneous solution. For example, the 30% NH$_4$OH and DI water have different densities and flow rates, and are difficult to dissolve homogeneously. When introduced into a manifold mixing system at low flow rates, the fluids tend to separate into layers, with the denser fluid settling to the bottom of the manifold.

Dilution tool 100 achieves the mixing function at flow rates as low as 0.1 milliliters per second by combining a first fluid (30% NH$_4$OH) and a second fluid (DI water) through filter 130 to form the desired 2% NH$_4$OH solution to remove residue from a wafer. The heaviest fluid or the fluid with the highest flow rate is introduced in filter above the other fluid so as to fall through the other fluid to prevent the fluids from segregating into stratified layers. In particular, the 30% NH$_4$OH is introduced into filter 130 at input port 132 and DI water is introduced at input port 133, where port 133 is disposed in filter 130 above port 132. In one embodiment, port 133 is disposed at an elevation approximately three centimeters above that of port 132.

Operation of filter 130 is as follows. Recall that the DI water flows to filter 130 at fifteen times the flow rate of 30% NH$_4$OH and that the NH$_4$OH is introduced into filter 130 at a lower level. Hence, the larger volume of DI water falls through and turbulates the 30% NH$_4$OH, thereby breaking up the NH$_4$OH boundary layers or gradients to improve mixing in filter 130. The turbulence results in more intimate contact between the fluids in filter 130, which is prolonged and enhanced by the tortuous path through filter element 131 to complete the formation of dilute 2% NH$_4$OH solution in filter 130. The desired 2% NH$_4$OH solution flows out of filter 130 through tube 153 to wafer scrubber 20.

It should be noted that other solutions can be formed through a filter besides dilute NH$_4$OH. For example, citric acid and DI water can be introduced into filter 130 to form dilute citric acid, which is a solution used for removing iron precipitates from the surface of a semiconductor wafer after metal polish.

To monitor the concentration of the 2% NH$_4$OH solution, prior art systems use chemical methods which sample the solution from the bulk storage tank. In a typical prior art system the concentration is determined by removing a sample of solution from the tank and measuring one of its physical or chemical properties, such as specific gravity. However, many wafers can be processed with the solution during the time needed to evaluate the sample, so substantial damage can occur before discovering that the concentration has fallen outside of the specified range. A further disadvantage of such systems is the need to open the system to the atmosphere to take the sample, increasing the risk of contamination and exposing persons in the vicinity to hazardous chemicals. Moreover, prior art systems are susceptible to samples not being representative of the bulk solutions because of the loss of volatile chemicals at sample taking, sample transport, sample storage, and sample assay, e.g., titration.

The present invention uses a conductivity meter 166 disposed in tube 153 to measure the conductivity or resistivity of the solution, which is a function of the concentration of NH$_3$. Conductivity meter 166 remains disposed in tube 153 such that a reading can be taken at any time, or even continuously, to determine conductivity. Such a determination is made in significantly less time than the sample evaluation which characterizes prior art systems. Hence, appropriate steps can be taken to reduce damage to wafers when a defective solution is detected. Conductivity meter 166 has the further advantage that concentration can be determined without opening the system, which reduces contamination and avoids the risk of exposing nearby persons to hazardous chemicals. Preferably, the conductivity window and the materials of construction are selected to match the chemical being detected, such as for example, NH$_3$, at the concentrations desired in the final mixture.

In an alternative embodiment, the sealless pumps could be driven by separate motors which can be controlled independently to adjust the solution at the filter output. The conductivity meter can measure the conductivity of the solution to provide a control signal to adjust the speed of each motor or the output stroke volume of each pump head to vary the concentration of the solution. The motor adjustment is provided by a feedback path from the conductivity meter to the motors which includes electrical or mechanical devices. Such an embodiment would have the benefit of adjusting the concentration of the output solution, e.g., 2% NH$_4$OH, when the concentration of the input fluids, e.g., 30% NH$_4$OH, varies.

EXAMPLE

To illustrate the invention over the prior art, three experiments were conducted using a dilution and delivery tool as follows:

In Experiment 1, deionized water at a flow rate of 1296 mls per min. and 30% NH$_4$OH at a flow rate of 57.6 mls/min. were mixed in a manifold. The dilution tool was continuously run throughout the experiment. The conductivity of the solution was measured in ten (10) minute intervals for a period of 2.5 hours with a conductivity meter. The measurement results are presented in the table below.

In Experiment 2 the deionized water and 30% NH$_4$OH were introduced into the manifold at the same flow rates as described above. The dilution tool was intermittently turned off during the experiment to simulate a wafer polishing process. The conductivity of the resulting solution was measured as described above and the results are presented in the table below.

In Experiment 3, the deionized water and 30% NH$_4$OH were introduced in the intermittent fashion described above onto the filter of the inventions at the same flow rates described above. The resulting filtermixed solution was measured for conductivity as described above and the results are presented in the table below.

| Experiment 1 Manifold Mixing/Constant Flow Conductivity in µS | Experiment 2 Manifold Mixing/Intermittent Flow Conductivity in µS | Experiment 3 Filter Mixing/Intermittent Flow Conductivity in µS |
| --- | --- | --- |
| 943 | 1100 | 1108 |
| 972 | 1121 | 1107 |
| 1065 | 1087 | 1108 |
| 1069 | 1087 | 1122 |
| 1072 | 1096 | 1122 |
| 1072 | 1083 | 1122 |
| 1105 | 1083 | 1111 |
| 1096 | 1096 | 1109 |
| 1051 | 1099 | 1116 |
| 1096 | 1099 | 1115 |
| 1099 | 1069 | 1114 |
| 1099 | 1122 | 1098 |
| 1074 | 1122 | 1097 |
| 1022 | 1024 | 1122 |
| 1002 | 1104 | 1122 |

It was observed that the conductivity of the solution mixed in the manifold in Experiment 1 spiked and dipped widely throughout the measuring period indicating that the $NH_4OH$ and DI of the solution was not homogeneously mixed, but rather remained as separate fluids of different conductivities with a range of conductivity from maximum to minimum of about 162 µS.

Although the conductivity readings of the solution of experiment 2 were more constant than those of experiment 1, the resulting solution also exhibited many fluctuations in conductivity and had a range of conductivity from maximum to minimum of about 50 µS.

In the inventive process and apparatus of experiment 3, the measured conductivities of the resulting filter mixed solution remained essentially constant and exhibited very low fluctuations in the range of less than about 25 µS. Such low fluctuations indicate that a homogeneous mixture was produced.

In summary, the present invention provides a novel dilution tool and a method of manufacturing an integrated circuit that includes preparing a solution of two fluids for removing residue from a semiconductor wafer. The fluids are mixed in a filter to form the desired solution. Sealless pumps driven by a common motor pump the fluids while maintaining a constant ratio of flow rates as the flow rate of the solution varies. The concentration of the solution is determined by measuring the conductivity with a conductivity meter. In one embodiment the solution's concentration is monitored and controlled in a closed loop control system by tilting the angle of the rotating piston within the pump cavity. A dilute $NH_4OH$ solution is formed in the amount needed, at exactly the time the solution is needed, avoiding the need to prepare and store bulk quantities of a solution whose concentration varies with the evaporation of $NH_3$ gas. The tool operates in a sealed enclosure to reduce safety and environmental hazards and the need to handle caustic chemicals.

What is claimed is:

1. A method of manufacturing comprising combining a first and a second fluid through a filter to form a solution by mixing the first and second fluids in the filter.

2. The method of claim 1, wherein the combining further comprises:

pumping the first fluid through the filter at a first flow rate; and pumping the second fluid through the filter at a second flow rate.

3. The method of claim 1, wherein the combining further includes introducing the first fluid into the filter at a first location and introducing the second fluid into the filter at a second location higher in elevation than the first location.

4. The method of claim 2, wherein the pumping of the first fluid includes pumping ammonium hydroxide into the filter, and the pumping of the second fluid includes pumping water into the filter at the second flow rate.

5. The method of claim 2, wherein the combining includes a step of forming dilute ammonium hydroxide solution at a third flow rate, further comprising the step of maintaining a ratio of the second flow rate to the first flow rate substantially constant as the third flow rate varies.

6. The method of claim 2, wherein the step of pumping the first fluid and pumping the second fluid further comprises maintaining a positive pressure on the fluids.

7. The method of claim 1, further comprising measuring a conductivity or a resistivity of the solution to determine the concentration of the solution.

8. The method of claim 7, wherein the step of measuring further comprises continuously measuring the conductivity or the resistivity of the solution.

9. The method of claim 1, further comprising removing residue from the integrated circuit and wherein the combining step occurs at the time of removing.

10. A method of manufacturing comprising:

providing a first fluid at a first flow rate;

providing a second fluid at a second flow rate, wherein the second flow rate is faster than the first flow rate; and flowing the second fluid through the first fluid to form a first solution in a filter.

11. The method of claim 10, further comprising:

flowing the first fluid through a first pipe to a first container; and monitoring the amount of first fluid in the first container.

12. The method of claim 10, further comprising:

flowing the first solution from the filter to a wafer scrubber; and scrubbing a semiconductor wafer using the first solution.

13. The method of claim 10, wherein the first fluid is a second solution.

14. The method of claim 13, wherein the first fluid is 30% $NH_4OH$, the second fluid is DI water and the first solution is 2% $NH_4OH$.

* * * * *